US012775052B2

(12) United States Patent
Johnny et al.

(10) Patent No.: US 12,775,052 B2

(45) Date of Patent: Oct. 27, 2026

(54) FAULT DETECTION FOR DC POWER LINES BASED ON DETECTED FREQUENCY RESPONSE CHANGES

(71) Applicant: Cence Power Inc., Markham (CA)

(72) Inventors: Milad Johnny, Thornhill (CA); Sagar Jaiswal, Milton (CA); Bolis Ibrahim, Toronto (CA); Willy Liu, Mississauga (CA); Daniel Darvishrahimabadi, Richmond Hill (CA); Will Andrew, Toronto (CA)

(73) Assignee: Cence Power Inc., Markham (CA)

( * ) Notice: Subject to any disclaimer, the term of this patent is extended or adjusted under 35 U.S.C. 154(b) by 202 days.

(21) Appl. No.: 18/619,966

(22) Filed: Mar. 28, 2024

(65) Prior Publication Data

US 2025/0306131 A1 Oct. 2, 2025

(51) Int. Cl.

*G01R 31/58* (2020.01)

*G01R 31/52* (2020.01)

(52) U.S. Cl.

CPC .............. *G01R 31/58* (2020.01); *G01R 31/52* (2020.01)

(58) Field of Classification Search

CPC ................................................ G01R 31/50–58

See application file for complete search history.

(56) References Cited

U.S. PATENT DOCUMENTS

| | | | |
|---|---|---|---|
| 3,668,659 A | 6/1972 | Hutchings | |
| 6,518,768 B1 | 2/2003 | Philippot et al. | |
| 8,743,513 B2 | 6/2014 | Ward et al. | |
| 8,781,637 B2 | 7/2014 | Eaves | |
| 9,184,795 B2 | 11/2015 | Eaves | |
| 10,104,610 B2 | 10/2018 | Heidler et al. | |
| 10,714,930 B1 | 7/2020 | Weiss et al. | |
| 10,732,688 B2 | 8/2020 | Goergen et al. | |
| 11,063,630 B2 | 7/2021 | Arduini et al. | |
| 12,248,032 B2 * | 3/2025 | Shea | H02H 5/12 |
| 2022/0050135 A1 | 2/2022 | Nordin et al. | |
| 2025/0283931 A1 * | 9/2025 | Goergen | G01R 31/52 |

OTHER PUBLICATIONS

Muniappan: "A comprehensive review of DC fault protection methods in HVDC transmission systems", in Protection and Control of Modern Power Systems, vol. 6, No. 1, pp. 1-20, doi: 10.1186/s41601-020-00173-9, dated Jan. 2021.

WIPO: PCT International Search Report and Written Opinion relating to PCT application No. PCT/CA2025,050390, dated May 8, 2025.

* cited by examiner

*Primary Examiner* — Lee E Rodak

*Assistant Examiner* — Demetrius R Pretlow

(74) *Attorney, Agent, or Firm* — Rowand LLP

(57) ABSTRACT

A fault detection system for detecting a fault condition in a direct current (DC) system. The system may include a transmitter including a DC source to energize a cable and a receiver connected to the cable and including a signal generator to generate a periodic signal. The transmitter may include a termination impedance matched to the characteristic impedance of the cable to absorb substantially all the periodic signal. The transmitter may include a fault detection circuit coupled to the cable to detect changes in the frequency response of the cable by tracking changes in the envelope of the power of the periodic signal and outputting a fault signal if the rate-of-change of the envelope of the power of the period signal exceeds a threshold level.

20 Claims, 6 Drawing Sheets

FAULT DETECTION FOR DC POWER LINES BASED ON DETECTED FREQUENCY RESPONSE CHANGES

FIELD

The present application generally relates to direct current (DC) power lines and, in particular, to methods and systems for fault detection on high voltage DC power lines.

BACKGROUND

High voltage power lines can be dangerous. DC can be a desirable option for power transmission in some cases so as to minimize alternating current (AC) line losses and to minimize AC-DC conversions in the case of DC loads. However, DC can be dangerous in that it does not have zero-crossings that can serve to self-extinguish an arc. In order to safely transmit high voltage DC power, a very high-speed fault detection mechanism is needed. For example, in a 450V rated system a clearing time for low resistance ground faults is about 5.4 milliseconds.

DC power transmission can be implemented as a two-wire system or a three-wire system. Faults can be human contact (one wire touch, or two wire touch), short circuit, open circuit, over voltage, or over current. Human contact can be dangerous and sometimes even fatal. Fast fault detection and power disconnection is an important safety feature.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1A:
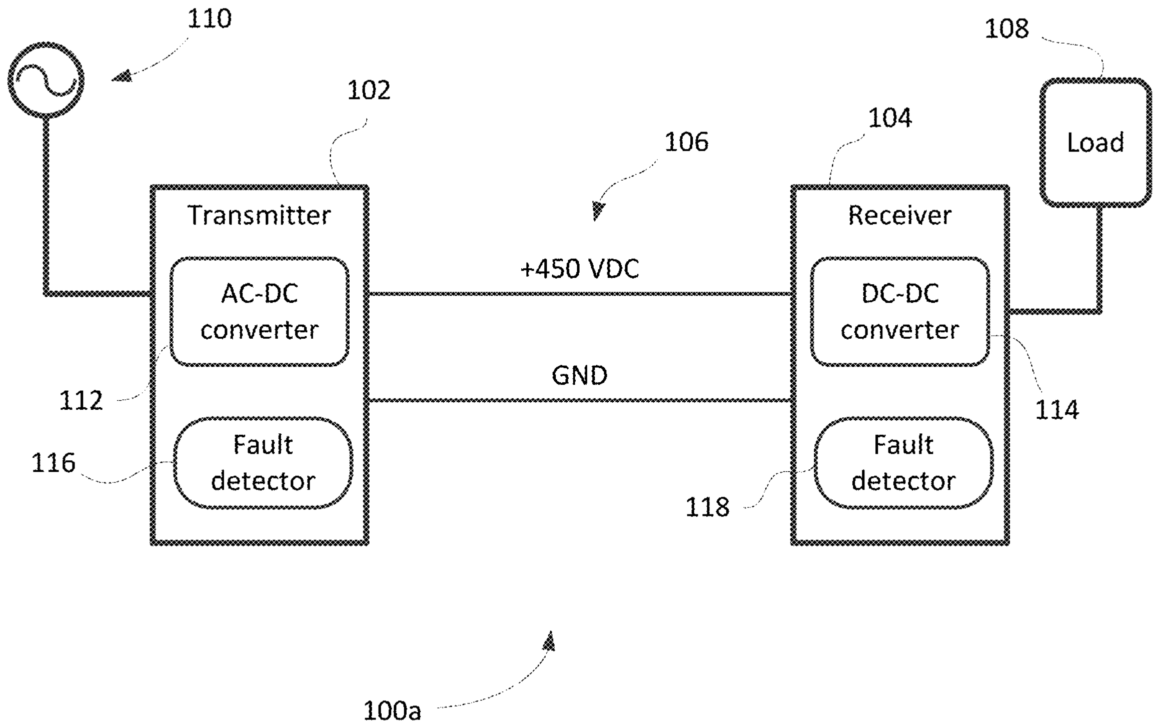
FIG. 1A diagrammatically illustrates an example of a basic DC power two-wire transmission system.

In a first aspect, the present application describes a fault detection system for detecting a fault condition in a direct current (DC) system. The system may include a power transmitter including a DC source to energize a cable and a power receiver connected to the transmission line to couple the cable to a load. At the power receiver the system may include a signal generator coupled to the cable to generate and propagate a periodic signal on the cable, and at the power transmitter the system may include a power detector coupled to the cable to receive the periodic signal after propagation through the cable and to output a power signal proportional to root-mean-square (RMS) power of the periodic signal, a differentiator to receive the power signal and to produce a power rate-of-change signal, and a fault detection circuit to output a fault signal based on the power rate-of-change signal.

In some implementations, the fault detection circuit includes a comparator to compare the power rate-of-change signal to a threshold level and to output the fault signal if the power rate of change signal is greater than the threshold level. In some cases, the fault detection circuit further includes a variance detector to monitor variance of the power rate-of-change signal and to adjust the threshold signal to ensure it remains above a noise level of the power rate-of-change signal.

In some implementations, the system includes a first bandpass filter to filter the periodic signal after propagation through the cable and before input to the power detector. In some cases, the system further includes a second filter to filter the power rate-of-change signal prior to the fault detection circuit to filter out rate-of-change values below a minimum rate. The second filter may be a second bandpass filter configured to filter out rate-of-change values above a maximum value.

In some implementations, the system may further include a transient filter at the output of the fault detection circuit to filter the fault signal to exclude transient short duration positive fault signals. In some cases, the transient filter includes a time delay circuit and a comparator to compare the fault signal to a delayed version of the fault signal to detect transient short duration positive fault signals.

In some implementations, the power detector includes a power amplifier to amplify the periodic signal received through the cable. The power amplifier may be a voltage-controlled amplifier, and the power detector may include a feedback loop providing a control signal to the voltage-controlled amplifier, the feedback loop including an integrator to produce the control signal based on a difference signal obtained from the difference between the power signal and a reference signal.

In some implementations, the signal generator is coupled to the transmission line through a first AC coupling, and the power detector is coupled to the transmission line through a second AC coupling.

In some implementations, the system includes a termination impedance at the power transmitter, wherein the termination impedance is selected to match a characteristic impedance of the transmission line.

In some implementations, the system includes a disconnection circuitry that receives the fault signal and is configured to disconnect the DC source from the transmission line in response to the fault signal. The disconnection circuitry may include a discharge circuit configured to couple the transmission line to ground in response to the fault signal when the transmission line is disconnected from the DC source.

In some implementations, the signal generator includes a modulator for modulating the periodic signal with a code. The code may be a pseudo-random code.

In some implementations, the signal generator is a sine wave generator, and the periodic signal is a sinusoidal signal.

In some implementations, the cable is configured as a transmission line or as a long-wire antenna.

In yet another aspect, the present application describes a fault detection system for detecting a fault condition in a direct current (DC) system. The system may include a power transmitter including a DC source to energize a cable and a power receiver connected to the cable to couple the cable to a load. The system may include, at the power receiver, a signal generator coupled to the cable to generate and propagate a periodic signal on the cable, and, at the power transmitter, means to measure root-mean-square (RMS) power of the periodic signal and to output a power signal proportional to the RMS power of the periodic signal, means to measure a rate-of-change of the power signal and to output a rate-of-change signal, and means to compare the rate-of-change signal to a threshold and to output a fault signal if the rate-of-change signal exceeds the threshold.

In some implementations, the system may further include means to filter the rate-of-change signal to exclude changes slower than a minimum rate and changes faster than a maximum rate.

Other aspects and features of the present application will be understood by those of ordinary skill in the art from a review of the following description of examples in conjunction with the accompanying figures.

In the present application, the terms “about”, “approximately”, and “substantially” are meant to cover variations that may exist in the upper and lower limits of the ranges of values, such as variations in properties, parameters, and dimensions. In a non-limiting example, the terms “about”, “approximately”, and “substantially” may mean plus or minus 10 percent or less.

In the present application, the term “and/or” is intended to cover all possible combinations and sub-combinations of the listed elements, including any one of the listed elements alone, any sub-combination, or all of the elements, and without necessarily excluding additional elements.

In the present application, the phrase “at least one of . . . or . . . ” is intended to cover any one or more of the listed elements, including any one of the listed elements alone, any sub-combination, or all of the elements, without necessarily excluding any additional elements, and without necessarily requiring all of the elements.

The present application relates to fault detection for power lines and, in particular, fault detection for DC power lines.

In this application, the term “high voltage” is intended to include any voltage that is unsafe to humans or may cause harm to the surrounding environment. This may include, for example, class 4 power lines.

A human touch fault may be modeled as a high resistance ground fault (HRGF) in some cases. A fault detection system ideally quickly detects occurrence of this condition and disconnects power from the transmission line as a result. The time between contact and power shut off should be within the range of 3.78 milliseconds to 5.59 seconds for a corresponding current of 6 mA to 990 mA, based on requirements of the UL 943 standard relating to ground-fault circuit interrupters.

A Human Body impedance model may be used in assessing capacitance-sensing based active injury mitigation systems. The characteristic impedance of a human body varies with frequency. At low frequencies (up to a few kHz), the impedance of the human body is primarily resistive, meaning it behaves like a simple resistor. This resistance is mainly due to the electrical resistance of tissues and fluids in the body. As the frequency increases into the radio frequency (RF) range (from a few kHz to several GHz), the impedance of the human body starts to exhibit capacitive and inductive components in addition to the resistive component. The impedance of the human body also varies depending on factors such as the body’s size, level of hydration/moisture, and the frequency range of interest. In practical terms, this means that the human body can interact differently with electromagnetic fields at different frequencies, influencing factors such as signal transmission through cables or antennas, as well as the absorption of electromagnetic radiation.

In the present application, the term “cable” may be used to refer to a two-wire or three-wire conductor for DC power transmission. The term “cable” is intended to encompass all suitable conductors for DC power transmission and, as will be described below, in some cases may be modeled or treated as a long-wire antenna or may be modeled or treated as a transmission line. The term “transmission line” may be referred to below when describing a connection between a DC power transmitter and a DC power receiver but that term should not necessarily be understood to mean in all cases that the connection is treated as a transmission line model, e.g. balanced positive and negative lines and a traveling sinusoidal signal having a reference to ground. In some cases, the described cable or transmission line may conform to an antenna model having an unbalanced signal.

FIG. 1A diagrammatically illustrates an example of a basic DC power two-wire transmission system 100*a*. The system 100*a* includes a power transmitter 102 at one end of a transmission line 106 and a power receiver 104 at the other end of the transmission line 106. In some examples, the power receiver 104 may be a transceiver, enabling the chaining of successive transmission lines from transceiver to transceiver.

In this example, the receiver 104 is coupled to a DC load 108. The transmitter 102 is connected to an AC power source 110, such as AC mains. The transmitter 102 may include a high power AC-DC converter 112 configured to produce high voltage DC power from the input AC power. In this example, the system 100*a* operates at +450 VDC. In this two-wire example, it will be noted that one wire is at ground and the other wire is at +VDC. The receiver 104 may include a DC-DC converter 114 to convert the +450 VDC to whatever DC voltage level is required by the load 108, and whatever VDC may be used internally at the receiver 104 for electronics and logic.

In this example, the transmitter 102 includes a fault detector 116 and the receiver includes a fault detector 118. The fault detectors 116, 118 are configured to quickly detect a fault on the transmission line 106, and in response to quickly disconnect the transmission line 106 from the AC power source 110 and to de-energize the transmission line 106.

Figure 1B:
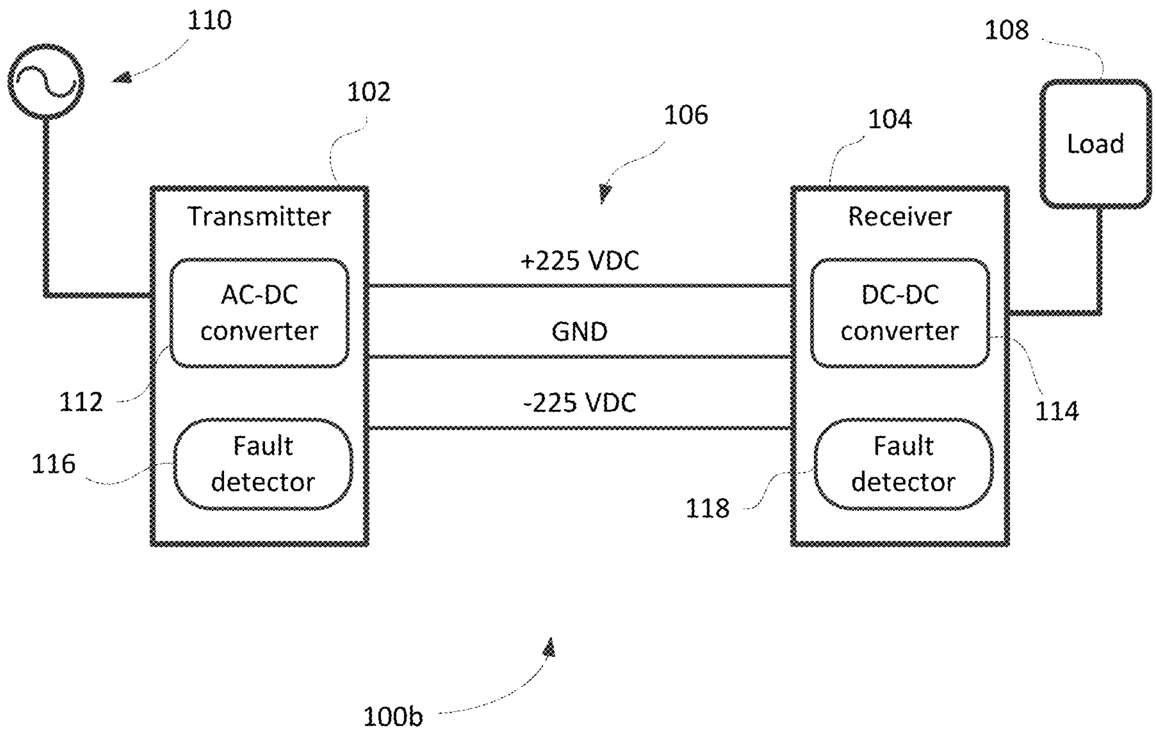
FIG. 1B diagrammatically shows an example of a three-wire DC transmission system.

FIG. 1B shows an example of a three-wire DC transmission system 100*b*. The three-wire DC transmission system 100*b* includes a transmission line 106 that features a ground wire, a +VDC wire and a-VDC wire. In this example, the same DC voltage of +450 VDC is achieved, but through setting the positive wire to +225 VDC and setting the negative wire to −225 VDC.

As noted above, high speed fault detection is advantageous. Various UL standards, including UL 943 and UL1400-1, address the issue of fault-management.

Fault detection in electrical systems may sometimes employ residual current detection (RCD) as the mechanism for identifying a fault condition. It has been found that RCD has insufficient sensitivity to reliably generate a fault detection from human touch. Increasing the number of turns of live wire for detection can improve sensitivity but results in longer clearing time and a shock sensation. Typical ground-fault circuit interrupters are too slow and are better suited to AC fault detection.

At least one attempt has been made to carry out fault detection by sending a low-frequency pulsed signal from the power transmitter to the power receiver and determining, from measured reflections, the reflection coefficient and, thus, the normal impedance of the transmission line. A change in the measured impedance may signal a possible fault. This technique still ends up being too slow for effective quick fault detection and disconnection.

The present application describes a fast fault detection system and method for DC power. The system exploits the skin effect for transmission lines. That is, at higher frequencies the current density of a signal is concentrated near the surface of an electrical conductor. As noted above, at higher frequencies, the human body can be modeled as a more complex impedance, including capacitive and inductive effects. The concentration of high frequency signals near the surface of a conductor make those signals more susceptible to environmental influences, including contact with objects, particularly human or other living bodies. A touch event thus impacts a number of parameters that affect the high frequency signals propagating on a conductor.

An electrical conductor can be modelled as a wired channel having a transfer function that exhibits an impulse response h (t). The frequency response of such a channel may be expressed as:

$$H(f) = \int_{-\infty}^{+\infty} h(t)e^{-j2\pi ft}dt$$

A fault, such as through a touch event, on the cable is effectively a variation in the normal impulse response and corresponding frequency response of the cable.

In the present application, a high frequency signal is propagated from a receiving end of the cable to the transmitting end. At the transmitting end, changes in the frequency response are detected by measuring the integral of a cross product of the original signal and the received signal. A significant variation may be indicative of a fault condition. In the simplified case of a pure tone sinusoidal signal, the frequency response may be estimated through monitoring of the envelope of the power of the received signal. A significant change in the envelope may be indicative of a fault condition. Various filters may be used to eliminate non-fault conditions or transient false positives.

Advantageously, using a periodic signal generator at the receiving end means that the fault detection system may further be leveraged to engage in a handshaking process prior to energizing the line with high voltage DC power from a power source. This handshaking process may improve safety of the transmission line through enabling using an initial low voltage AC signal from the periodic signal generator to confirm the line is correctly connected and ready for high voltage energy. This may eliminate or reduce the risk of high voltage arcs/faults.

The present system may further enable chaining of termination points, wherein the receiver is constructed as a transceiver enabling it to serve as a receiver termination end for a first portion of the transmission line and as a transmitter termination end for a subsequent portion of the transmission line.

Figure 2:
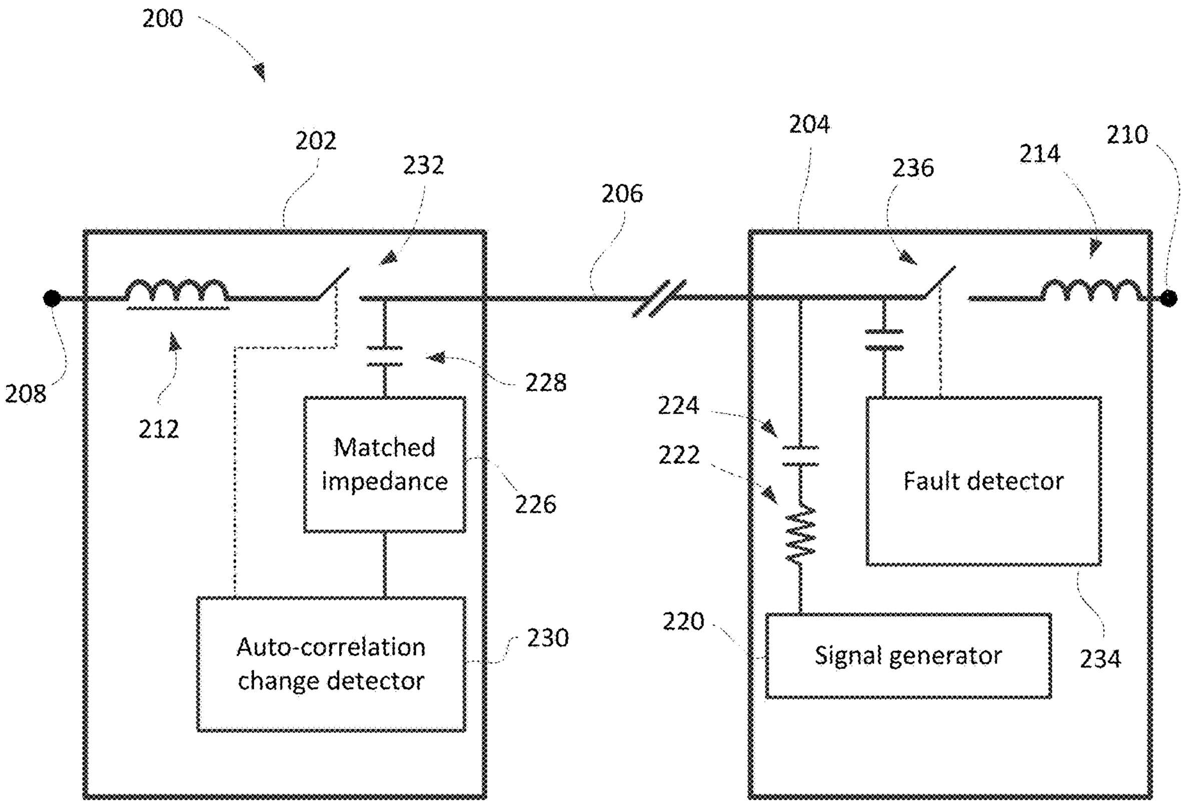
FIG. 2 shows one simplified example fault detection system for DC power transmission.

Reference will now be made to FIG. 2 which shows one simplified example fault detection system 200 for DC power transmission. The system 200 in this example includes a transmitter 202 and a receiver 204 at respective ends of a transmission line 206. The transmission line 206 may be a two-wire cable in some implementations and may be a three-wire cable in some implementations. The system 200 is configured to connect a DC source 208 to a load 210. In some cases, the transmitter 202 may include power conversion components (not shown) to convert DC-to-DC and/or to convert AC-to-DC to realize the DC source 208. For example, the transmitter 202 may be connected to AC mains power and may include one or more power converters to realize the DC source 208 for producing high voltage DC power. The DC source 208 may provide up to 450 VDC in some implementations. Other voltage levels may be used in other implementations.

In this example, the DC source 208 is coupled to the transmission line 206 through a source filter inductor 212 and the transmission line 206 is coupled to the load 210 through a load filter inductor 214. The filter inductors 212, 214 may, in part, isolate the transmission line 206 from either the DC source 208 or the load 210. This may protect components of the DC source 208 and/or the load 210 from AC signals on the transmission line 206, and may isolate the transmission line 206 from interference signals generated within the DC source 208 or the load 210 that may hamper fault detection.

The system 200 is configured to quickly detect a fault condition. The system includes a signal generator 220 configured to generate a periodic signal at the receiver 204 in this example. The periodic signal may be a sinusoidal signal in some implementations. Although other periodic signals may be generated, such as sawtooth, square wave, or other such signals, many implementations will use a sinusoidal signal. In some cases, as will be described further below, the signal may be modulated. That is the signal generator 220 may generate a pseudo-noise code or pseudo-random-noise code, that is upconverted using a high frequency carrier signal. In some examples below, the signal generator 220 outputs a single tone sinusoid, i.e. an unmodulated high frequency carrier signal.

The transmitter 202 may include a matched impedance 226 selected to closely match the impedance of the channel (the transmission line 206) so as to reduce or minimize reflected energy. In an ideal case, the matched impedance 226 ensures total absorption of the periodic signal with no reflection. The matched impedance 226 may be coupled to the transmission line 206 through a blocking capacitor 228 to protect it from the high voltage DC energy on the transmission line 206.

The transmitter 202 includes a fault detection circuit, which in this example includes an auto-correlation change detector 230. The auto-correlation change detector 230 measures correlation between the periodic signal received after propagation through the transmission line 206 and a delayed version of itself. In particular, the auto-correlation change detector 230 detects a fault through detecting a change in the frequency response of the transmission line 206 by way of detecting a greater-than-threshold change in the auto-correlation.

The auto-correlation change detector 230 is coupled to a switch 232 that couples the DC source 208 to the transmission line 206 such that if the auto-correlation change detector 230 detects a greater-than-threshold change in the frequency response of the transmission line 206, it opens the switch 232 to disconnect the transmission line 206 from the DC power source.

In some implementations, the receiver 204 may also include a fault detector 234. The receiver-side fault detector 234 may be configured to detect reflections of the periodic signal. Under normal operating conditions, the matched impedance 226 may ensure that there are no significant reflections of the periodic signal, such that the receiver-side fault detector 234 may expect no, or extremely small, high frequency signals. If a fault occurs on the line, the impedance of the transmission line 206 changes. Reflections may occur at the location of the fault, where an object in contact with the transmission line 206 may introduce impedance that will cause reflection and distortion of the periodic signal. The change in impedance of the transmission line 206 may also result in a mismatch with the matched impedance 226, thereby resulting in reflected energy. The receiver-side fault detector 234 may be configured to detect a greater-than-threshold reflected energy under a fault condition and, in response, trigger a disconnection and discharge of the transmission line 206 at the receiver end.

In some implementations (not shown in FIG. 2), the transmitter 202 may include a separate periodic signal generator to propagate a signal towards the receiver 204. The fault detector 234 at the receiver 204 in such an embodiment may be configured to operate in a manner similar to the auto-correlation change detector 230 by detecting a change in the frequency response based on the received high frequency signal at the receiver 204.

Figure 3:
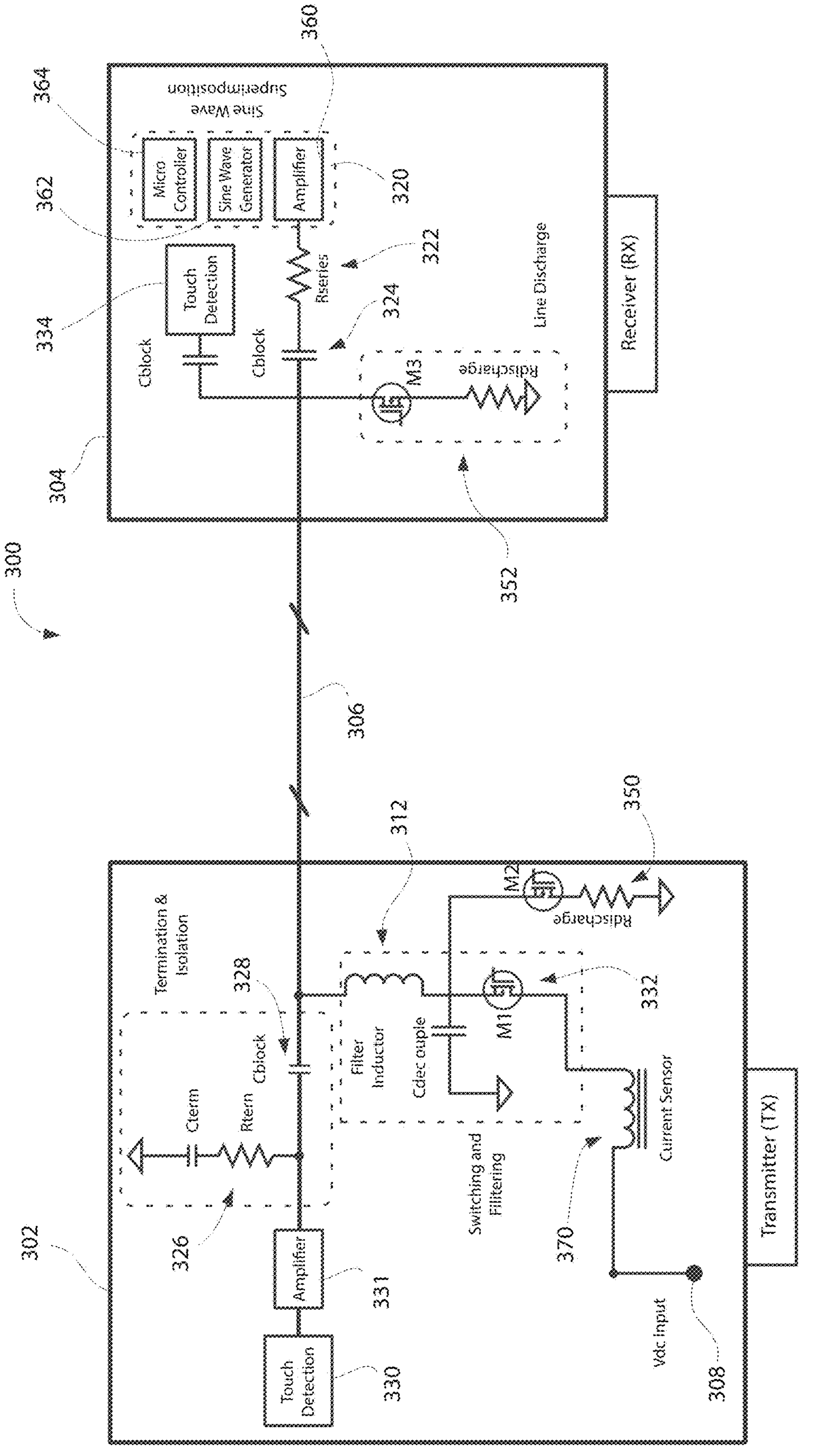
FIG. 3 shows a simplified circuit diagram of one example system for fault detection in a DC power system.

Reference will now be made to FIG. 3, which shows a simplified circuit diagram of one example system 300 for fault detection in a DC power system. The system 300 in this example includes a transmitter 302 and a receiver 304 at respective ends of a transmission line 306. The transmission line 306 may be a two-wire cable in some implementations and may be a three-wire cable in some implementations. The system 300 is configured to connect a VDC input power source 308 to a load (not shown). The VDC input power source 308 may provide up to 450 VDC in some implementations. Other voltage levels may be used in other implementations.

In this example, the VDC input source 308 is coupled to the transmission line 306 through a source filter inductor 312. The filter inductor 312 may, in part, isolate the transmission line 306 from the VDC input source 308 to protect components of the VDC input source 308 from AC signals on the transmission line 306, and/or to isolate the transmission line 306 from interference due to transient signals or noise generated within the VDC input source 308 that may hamper fault detection.

The receiver 304 includes a signal generator 320 to generate a periodic signal for transmission on the transmission line 306. The transmitter 302 includes a matched impedance 326 formed, in this example, from a resistor and capacitor and coupled to the transmission line 306 through a blocking capacitor 328. The matched impedance 326 is configured to have an impedance generally matched to the characteristic impedance of the transmission line 306, so as to ensure most or all of the incident periodic signal from the signal generator 320 is absorbed and not reflected back down the transmission line 306.

The periodic signal in this example is a sinusoidal signal. In some cases, the sinusoidal signal may be a carrier signal that may be modulated by a code sequence. In this example, the sinusoid is a single tone sinusoid. In some cases, the frequency of the signal is between about 50 kHz and 50 MHz.

The periodic signal is significantly lower in amplitude than the high voltage DC power signal in most implementations. In some examples, the DC power signal may be at around 450 VDC. The periodic signal in some implementations may be between about 5V and 40V peak-to-peak.

In this example implementation, the system 300 includes disconnection circuitry at the transmitter 302 to disconnect the VDC input source 308 from the transmission line 306 in the event of a fault detection and includes line discharge circuitry at both the transmitter 302 and receiver 304 for discharging capacitance on the line once a fault has been detected. At the transmitter 302, an amplifier 331 and transmitter-side touch detection circuitry 330 are provided to detect a fault condition through detecting a greater-than-threshold change in the frequency response of the transmission line 306. The amplifier 331 generates an amplified signal corresponding to the AC signal that passes through the blocking capacitor 328. The touch detection circuitry 330 controls a switch 332, which in this example is implemented using a MOSFET. Other or additional circuit elements may be used to implement the switch. A current sensor 370 may be used for overcurrent protection.

The touch detection circuitry 330 may also control a transmitter-side discharge circuit 350, which in this example is implemented using a MOSFET and a discharge resistor. In the event of a detected fault condition, the transmitter-side touch detection circuitry 330 quickly opens the MOSFET of the switch 332 to disconnect the VDC input source 308 and closes the MOSFET of the transmitter-side discharge circuit 350 to quickly discharge the built-up energy on the transmission line 306.

At the receiver 304, receiver-side touch detection circuitry 334 is coupled to the transmission line 306 to detect the fault condition through detecting the greater-than-threshold reflection of the periodic signal on the transmission line 306. The touch detection circuitry 334 controls a receiver-side discharge circuit 352 that is quickly closed when a fault condition is detected to couple the transmission line 306 to ground and discharge the line from the receiver end. In this example, the receiver-side discharge circuitry 352 is implemented using a MOSFET and a discharge resistor. In this manner, when a fault is detected by both the transmitter-side touch detection circuitry 330 and the receiver-side touch detection circuitry 334, then the VDC input source 308 is disconnected from the transmission line 306 and both ends of the transmission line 306 are quickly coupled to ground through discharge resistors as so to rapidly dissipate the charge on the line and avoid the risk of arcs, sparks or other hazards. By discharging both ends of the cable, the speed with which the line is de-energized is improved.

The signal generator 320 in this example includes a sine wave generator 362 and an amplifier 360. It further includes a suitably-programmed microcontroller 364 in this example. In some cases, the suitable-programmed microcontroller 364 may be replaced with an application-specific integrated circuit (ASIC) or another form of digital controller for controlling operation of the sine wave generator 362 and the amplifier 360. In some cases, the microcontroller 364 may further receive signals from the receiver-side touch detection circuitry 334. In some cases, the microcontroller 364 may be configured to control discharge of the line, output notification signals, and/or engage in a handshake process prior to energizing of the transmission line 306. In this example, the microcontroller 364 may be configured to set the frequency of the periodic signal generated by the sine wave generator 362. In some cases, the microcontroller 364 may be configured to output a pseudo-random code that is upconverted by mixing with the sinusoidal carrier signal generated by the sine wave generator 362.

The signal generator 320 may be coupled to the transmission line 306 through a series resistor 322 and a blocking capacitor 324. The series resistor 322 serves as an impedance matching resistor and it modifies the series cable resistance so as to improve sensitivity of the touch detection.

The output of the sine wave generator 362 may be a periodic signal with a peak-to-peak amplitude of about 1.2 V. The amplifier 360 may increase the amplitude of the signal to about 12 V peak-to-peak. In other implementations, other voltage levels may be used. In some implementations, the transmission line operates at, at least, 300 VDC and the periodic signal has a peak-to-peak amplitude of between about 10V and 24V. In some cases, the transmission line may operate at any DC level over +60 VDC.

Advantageously, the above-described system can be implemented in a way that achieves high speed detection of a fault condition, and high speed disconnection and discharge of the transmission line. While other fault detection apparatuses may take as little as 1-3 milliseconds at best to detect a fault condition, the present application describes apparatuses that can detect a fault condition within microseconds and, in some implementations, within nanoseconds.

As noted above, the transmission line can be modeled as a channel having a frequency response given as:

$$H(f) = \int_{-\infty}^{+\infty} h(t)e^{-j2\pi ft}dt$$

In cables used for power transmission, the above mathematical model of the channel represents the frequency representation model of the cable, which is a low pass filter, where the frequency response depends on the characteristics of the cable, environmental conditions and many other factors. For an input signal, x(t), superimposed (or injected, or coupled) onto the cable, the received signal can be modeled by:

$$y(t) = x(t) * h(t),$$

In the above relation, "*" represents the convolution operation that can be modeled as follows:

$$y(t) = \int_{-\infty}^{+\infty} x(\tau)h(t-\tau)d\tau$$

In the frequency domain, wherein the input signal is X(f) this modeling can be expressed as:

$$Y(f) = H(f)X(f)$$

Electrical faults on the cable can create variation in the normal impulse response and corresponding frequency response of the cable with regard to time. Accordingly, in this sense the channel can be modeled as a liner time variant system where its characteristics change in the presence of a fault. The frequency representation model of the received signal as a time variant system is thus:

$$Y(f, t') = H(f, t')X(f)$$

$$h(t, t') = \sum_{i=0}^{\infty} \alpha_i(t')\delta(t - t_0 - i\tau_s)$$

The above expression reflects the time-variant impulse response h(t, t') of the cable. In the above expression, $$t_0 = \frac{l}{c_0\sqrt{\epsilon_r\mu_r}},$$

l is the length of the cable, $c_0 = 3\times10^8$ represents the speed of light in vacuum, $\in_r$ is dielectric permittivity, $\mu_r$ is a magnetic permeability constant of the medium, $\alpha_i(t')$ is a parameter that is dependent on the environmental conditions and any fault on the cable, and $\tau_s$ represents a time resolution constant used for representing channel impulse response in the time domain. The value of $\tau_s$ depends in part on the bandwidth (BW) of the channel under analysis that, based on the Nyquist sampling rate theorem, may be calculated as $$\frac{1}{2BW}.$$

In order to detect a fault on the cable, the system may monitor for changes in the frequency response of the channel. This measurement can be done on a narrow frequency bandwidth, or a wide enough frequency bandwidth to cover the most dramatic changes in the frequency response of the cable during the presence of a fault.

One method of detecting a fault, using the measurement of the variation of the frequency response of the channel, is to inject/couple a specific signal onto the cable and measure changes in the cable's impulse response. The injected signal should have characteristics such that the correlation of the signal with a delayed copy of itself (also known as autocorrelation) is very low. Good candidates for this type of signal include a random sequence such as a pseudo-noise code (PN code) or pseudo-random-noise code, Barker code, or binary Alexis sequences, as examples. The use of codes will be discussed further below; however, in some cases analysis can rely on measuring the frequency response of the cable at a single frequency, in which case the system can use a single-tone sinusoidal signal at that specific frequency.

Figure 4:
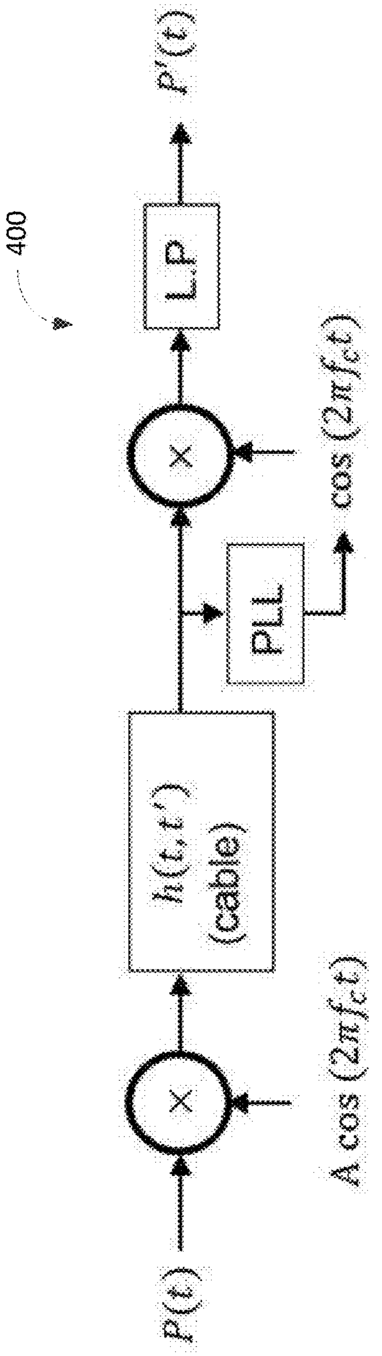
FIG. 4 shows a simplified example system for detecting a fault on a transmission line.

Reference is now made to FIG. 4, which shows a model of a system 400 for detecting a fault on a transmission line. At the DC power receiver end of the system 400, a code signal P(t) is used to modulate a carrier frequency A cos ($2\pi f_c$t). The modulated signal passes through the cable having a time variant frequency response of h(t, t'). At the power transmitter end of the system 400 a phase-locked loop is used to extract the carrier signal and to use it to demodulate the received signal to recover P'(t). Based on cross-correlation between the transmitted sequence and the received sequence, P(t) and P'(t), the system 400 is able to track the impulse response, which is the channel frequency response in the time domain.

As noted above, the simplified approach is to use P(t)=1, to create a transmitted signal of a single frequency with a bandwidth of zero (i.e. pure tone), allowing for all the power of the transmitted signal to be focused in a specific frequency. In this case, the variation of the channel's impulse response is monitored for a specific frequency.

Figure 5:
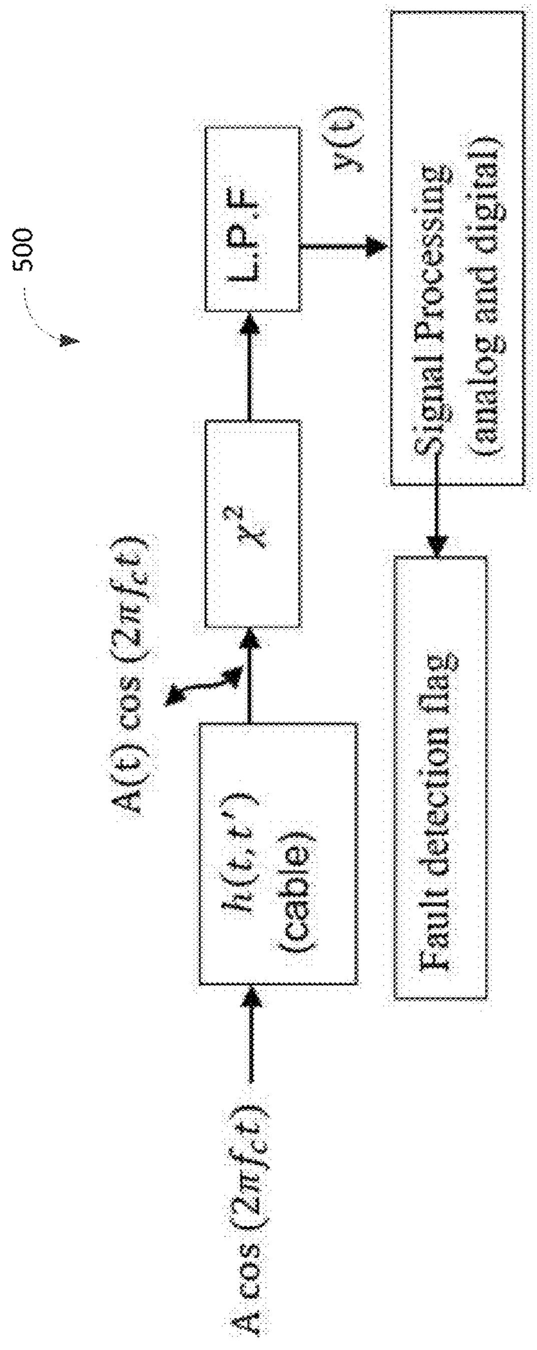
FIG. 5 shows another simplified example system for detecting a fault on a transmission line based on use of a single frequency signal.

FIG. 5 shows an example system 500 for detecting a fault on a transmission line based on use of a single frequency signal. In this example, the transmitted signal is A cos($2\pi f_c$t). The complication of a phase-locked loop can be eliminated in this situation. The received signal is mixed with itself, A(t) cos($2\pi f_c$t), where the value of A(t) is related to the frequency response of the cable at the specific carrier frequency $f_c$. Its value may be understood as:

$$A(t)=AH(f_c,t)$$

The signal squared given by block $X^2$ is represented by:

$$\chi^2=(A(t)\cos(2\pi f_c t))^2=\frac{A^2(t)(1+\cos(4\pi f_c t))}{2}$$

Once the signal squared is low pass filtered, the filtered signal y(t) is related to the channel frequency response:

$$y(t)=\frac{A^2(t)}{2}=\frac{A^2}{2}H(f_c,t)^2$$

Accordingly, the filtered signal tracks changes in the cable's frequency response proportional to $H(f,t)^2$ at the specific carrier frequency $f_c$.

It will further be appreciated that the above expression regarding the filtered signal y(t) is proportional to the power of the received signal. In other words, the changes in the cable's frequency response can be monitored through monitoring changes in the received signal's power envelope.

Figure 6:
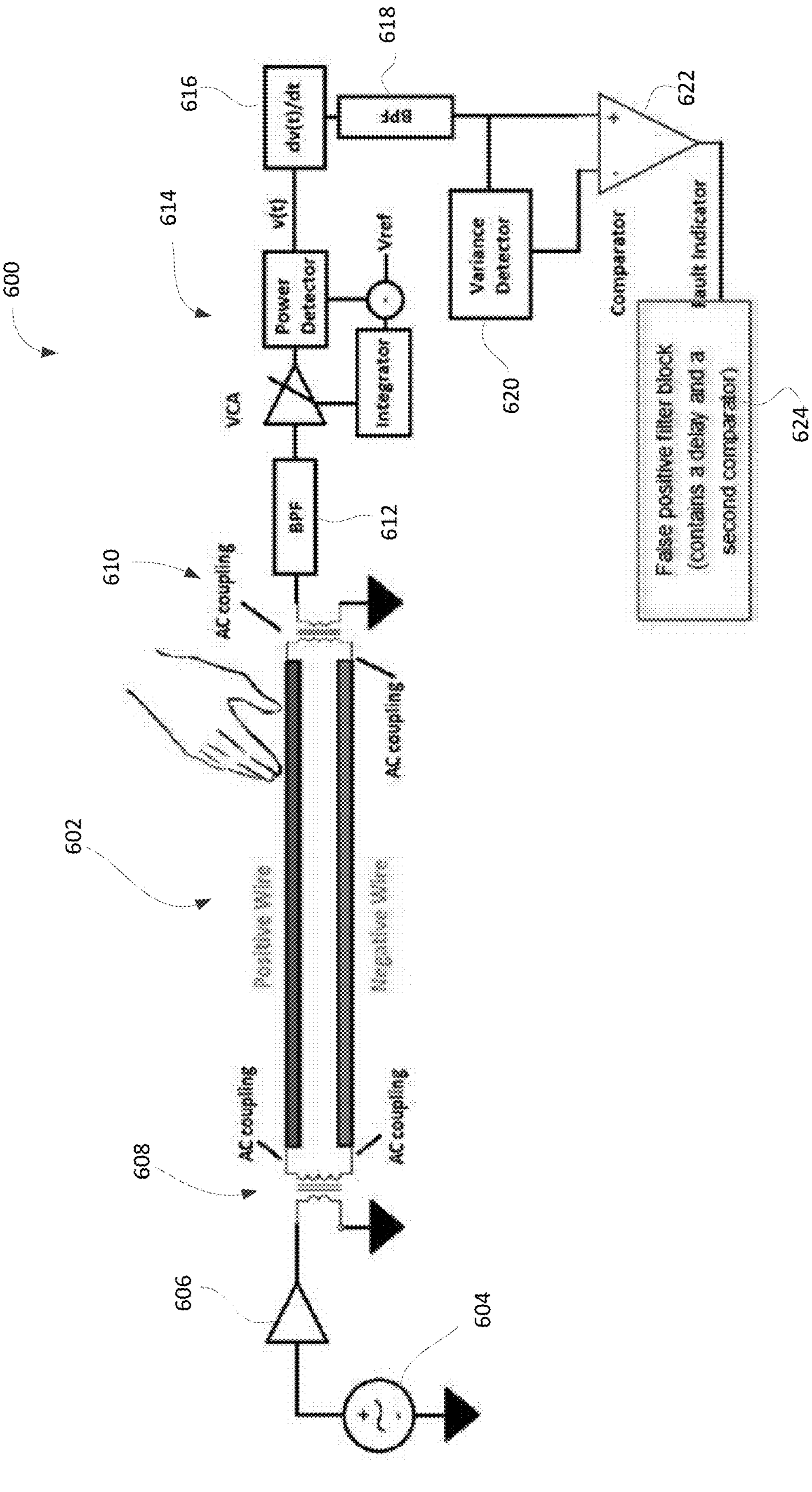
FIG. 6 shows a simplified block diagram of one example of a fault detection system for a high-power DC transmission line.

Reference will now be made to FIG. 6, which shows a simplified block diagram of one example of a fault detection system 600 for a high-power DC transmission line. The fault detection system 600 in this example is configured to identify variation in the cable's frequency response through identifying changes in a sinusoidal signal's power envelope.

The high-power DC transmission line in this example includes a cable 602. In this case, the cable 602 is a two-wire cable. The cable 602 has a DC voltage applied to it (not shown) to transmit DC power. The fault detection system 600 includes, at the DC power receiving end of the cable 602, a sinusoidal signal generator 604. In this example, the sinusoidal signal generator 604 outputs a single frequency unmodulated signal cos $(2\pi f_c t)$. The signal is amplified by amplifier 606 and coupled to the cable 602 through a first AC coupling 608. Other filtering or protection components may be included that are not shown in this simplified example.

At the DC power transmitting end of the cable 602, a second AC coupling 610 couples the cable 602 to the frequency response measurement and detection portion of the fault detection system 600.

The received signal, A(t) $\cos(2\pi f_c t)$, is passed through a first bandpass filter 612 to remove any out-of-band noise. The bandpass filtered signal output from the first bandpass filter 612 is then input to a power detector 614. The power detector 614 is configured to output a signal tracking the root-mean-square (RMS) value of the power of the received signal. The power detector 614 outputs an RMS power signal that is proportional to the frequency response of the cable 602.

In this example, the power detector 614 includes a voltage-controlled amplifier that receives a control signal from a feedback loop that includes an integrator which receives a difference signal obtained based on the difference between the RMS power signal and a reference signal. The feedback loop may be configured to manage the amplification of the received and bandpass filtered signal so as to ensure that the average received signal power is within a specific range, making the power detector very sensitive to variations in input signal power. Nevertheless, the automatic gain control of the voltage-controlled amplifier is configured so as not to unintentionally filter out any rapid variations in the output of the power detector that correspond to likely fault events.

The RMS power signal is input to a differentiator 616. The differentiator 616 may be an op amp differentiator in some cases. The differentiator 616 outputs a rate-of-change signal representing the rate-of-change of the RMS power signal. In other words, the rate-of-change signal is proportional to the rate-of-change of the frequency response of the cable 602. A significant and sudden change in the frequency response of the cable 602 may be indicative of a fault on the cable 602, which may then be used as the basis for triggering a disconnection of DC power from the cable and discharge of the line.

The detection in this example implementation includes some false positive filtering. Changes in the frequency response of the cable 602 can occur due to a number of possible events, such as environmental changes or physical movement of the cable 602. For example, even small physical disturbances that do not amount to touch events, such as an object pressing on the cable 602, wind events, and the like, can alter the physical characteristics of the cable 602 and the spacing between conductors. This may alter the frequency response of the cable 602, which may cause a fault to be detector erroneously.

A true electrical fault caused by, for instance, a human or animal skin touch event, causes a rapid change in the frequency response and, accordingly, the power signal envelope. Mechanical events, like vibrations, compression, and other physical adjustments to the cable 602, such as variation in conductor spacing, tend to occur over a slower timeline. The slower rate of a physical event means that the resultant change in the frequency response and, thus, the change in the power signal envelope, is much slower than in the case of an electrical fault. Therefore, a second filter 618 may be used to filter out changes that are too slow, i.e. to exclude changes below a minimum rate. In some cases, the second filter 618 may be a second bandpass filter used to also filter out changes that are too fast, such that they may be anomalous transient signal noise rather than an indication of a true electrical fault. The second filter 618 results in a filtered rate-of-change signal.

The filtered rate-of-change signal may then be compared to a threshold value or threshold signal to determine whether it indicates a fault condition using a fault detection circuit. In this example, a comparator 622 may be used to compare the filtered rate-of-change signal to a threshold signal and the comparator 622 may output a fault signal indicating a fault if the filtered rate-of-change signal indicates a sufficiently significant change in the RMS power envelope of the traveling sinusoidal signal injected onto the cable 602.

In this particular example, the threshold signal input to the comparator 622 may not be a fixed threshold but may instead by varied slightly over time using a variance detector circuit 620. The variance detector circuit 620 may be configured to dynamically adjust the threshold signal to account for the fact that the environment may have changing RF noise and other artefacts that may necessitate gradual adjustments to sensitivity of the fault detection circuitry and, in particular, the threshold signal. That is, a certain amount of electrical noise may be present in the filtered rate-of-change signal despite the filtering of the first bandpass filter 612 and the second filter 618. That noise floor may slowly vary over time due to changes in the RF environment and other environmental factors. To ensure that the noise floor does not rise above a preset threshold level, the variance detector circuit 620 may be configured to monitor the signal over time and, in particular, its variance, and to adjust the threshold signal by setting it to an offset value above the peak signal value. Variance may be considered proportional to the power of the noise. If the noise gradually drifts upwards over time, the threshold signal rises with it and, if the noise gradually decreases over time, the threshold signal decreases so as to improve the fault detection sensitivity. In some cases, the variance detector circuit 620 is configured to track variance of the filtered rate-of-change signal over time. In some cases, the variance detector circuit 620 may be replaced with an average or peak value detector.

In some cases, a second stage of false positive filtering may be implemented at the output of the comparator 622. The second stage may feature a transient filter 624 configured to filter out a positive fault signal that is only detected and present for a very short period of time. In some cases, the transient filter 624 may be implemented using a time delay, such as an R-C time delay circuit and a second comparator in order to compare the fault signal with a slightly delayed version of itself. In that manner, the transient filter 624 can determine whether the fault signal remains positive for a sufficiently long period of time to be deemed a detection of a true electrical fault. The transient filter 624 then outputs a fault detection signal that may be acted upon by the fault detection system 600 to disconnect DC power and discharge the cable 602, as described in examples above.

Not shown in FIG. 6 are the impedance matching components at the DC power transmitting end of the cable 602 that are configured so as to closely match the characteristic impedance of the cable 602, thereby minimizing reflection of the sinusoidal signal and maximizing absorption.

As mentioned above, a DC power cable on which the above-described fault detection system is implemented may be modelled as a long-wire antenna or as a transmission line in some cases. If the cable is short enough, then it may be suitable to model it as a long-wire antenna; whereas if it is sufficiently long then it may be modelled as a transmission line. The difference in the way the cable is modeled or treated may impact the nature of the termination at its ends. For example, in the case of a long-wire antenna the sinusoidal signal injected propagates in an unbalanced manner, and the cable acts as a sort of waveguide for transmission of the signal. A balun may be used in the coupling in such circumstances.

For a long-wire antenna, an impedance or termination may be coupled to the end of the cable, away from the sinusoidal signal feed point. By selecting the right impedance to match the impedance of the channel, the reflected energy is ideally reduced to zero (maximum absorption), as described above. In the case of a two-wire cable, the coupling of the sinusoidal signal may propagate the signal on both the positive and negative wires. That is, both of the wires carry the same sinusoidal signal, acting together as a simple long-wire antenna that acts as a waveguide, guiding the TM (transverse magnetic) from the DC power receiver end to the DC power transmitter end of the cable. The electromagnetic wave is wholly concentrated toward the terminated end. An implementation of the terminated long-wire antenna may be understood to include not only the long pair of wires that are parallel to the ground, but also two terminating sections. These may be notionally considered to be vertical to the ground. At one end of the antenna is a feed point, usually taken between the vertical leg and ground. At the other end is a vertical section as long as necessary to connect to the terminating impedance. The terminating impedance may have one end directly connected to ground and the other end connected to the vertical section. When the height of the antenna is very small relative to a wavelength, the antennas may be labelled "Beverage antennas". Such antennas, which are very long and low to the ground, may find use as MF and lower HF receiving antennas. When the antenna is an appreciable distance above ground, such as about 1-wavelength above ground, it may be referred to as a terminated end-fed long-wire directional antenna. In modelling the terminated long-wire antenna normally account could be made for the vertical wires needed to make both feed point and termination connections. If the cable behaves as a long-wire directional antenna it may be more sensitive to fault detection.

Ideally, an impedance is selected that will provide the proper conditions for achieving full traveling-wave status. The calculation may be based on treating the wire as a transmission line, and the load impedance should match the characteristic impedance of the line. In one example, the proper value for such a termination may be modelled as:

$$R_L = 138 \log_{10}\left(\frac{4h}{d}\right)$$

In the above expression $R_L$ is the value of the load impedance in Ohms, h is the height of the wire, and d is the wire diameter. Note that the impedance of the line and hence the approximate load value is independent of frequency and dependent only upon a set of physical measurements that use the same units of measurement.

In some cases, the transmission line may be modeled as an RLC circuit with a series R-L component and a parallel capacitance component. The characteristic impedance of the transmission line may be expressed as:

$$Zo = \sqrt{\frac{R + j\omega L}{G + j\omega C}}$$

In the above expression, $Z_0$ is the characteristic impedance, R is the resistance per unit length, G is the conductance of the dielectric per unit length, L is the inductance per unit length, and C is the capacitance per unit length. The above expression is particularly applicable in the transition zone between high frequency and low frequency operation. At low frequency, the inductance and conductance are negligible and the impedance may be simplified as:

$$Zo = \sqrt{\frac{R}{j\omega C}}$$

At high frequency, the frequency terms dominate and the expression ends up reducing to:

$$Zo = \sqrt{\frac{L}{C}}$$

As described earlier above, the measurement of frequency response changes on the cable may be carried out using an unmodulated single-tone sinusoidal signal. However, as mentioned, a wider bandwidth signal may be used in some cases. In some instances, a modulated signal may be transmitted. The injected signal may be selected so as to have a wide enough frequency bandwidth to cover the most dramatic changes in the frequency response of the cable during the presence of a fault.

In some cases, frequency response changes may be identified based on autocorrelation, i.e. correlation between the signal and a delayed copy of itself. Ideally, the injected signal should have characteristics such that correlation of it with a delayed copy of itself is very low. Good candidates for this type of signal include a random sequence, such as a PN code or pseudo-random-noise code, Barker code, or binary Alexis sequences, as examples.

In one example, consider a sequence $$P(t)=\sum\nolimits_{i=0}^{\infty}a_i c(t-iT_c)$$

where $a_i\in\{-1,1\}$ is a PN-sequence with a length of $NT_c$. In this example, $T_c$ is the chip duration, i.e. the time allocated to each bit of the sequence, and N is the number of bits. A correlation function may be expressed as follows:

$$E\{c(t)c(t-\tau)\}=R_c(\tau)=\begin{cases}1-\frac{N+1}{NT_c}|\tau|, & |\tau|<T_c\\ -\frac{1}{N}, & |\tau|>T_c\end{cases}.$$

Also, in one example, N can be set to 1 and $a_i=1$ (where $a_i$ is the possible set of values that the code sequence can take on, either 1 or −1). If N is selected to be large enough, the spectrum of $R_c(\tau)$ (which is the autocorrelation function) can be calculated as follows:

$$S_c(f)=\int_{-\infty}^{+\infty}R_c(\tau)e^{-j2\pi f\tau}dt=\left(\frac{\sin\left(\frac{2\pi f}{f_c}\right)}{\frac{2\pi f}{f_c}}\right)^2,$$

In the above expression, $$f_c=\frac{1}{T_c}.$$

As $T_c$ (the chip duration) approaches zero, the bandwidth of the sequence increases, while for higher values of $T_c$, the bandwidth of the original sequence decreases. For lower values of $T_c$ we can monitor wider bandwidths of the cable's frequency response, and vice-versa.

Figure 7:
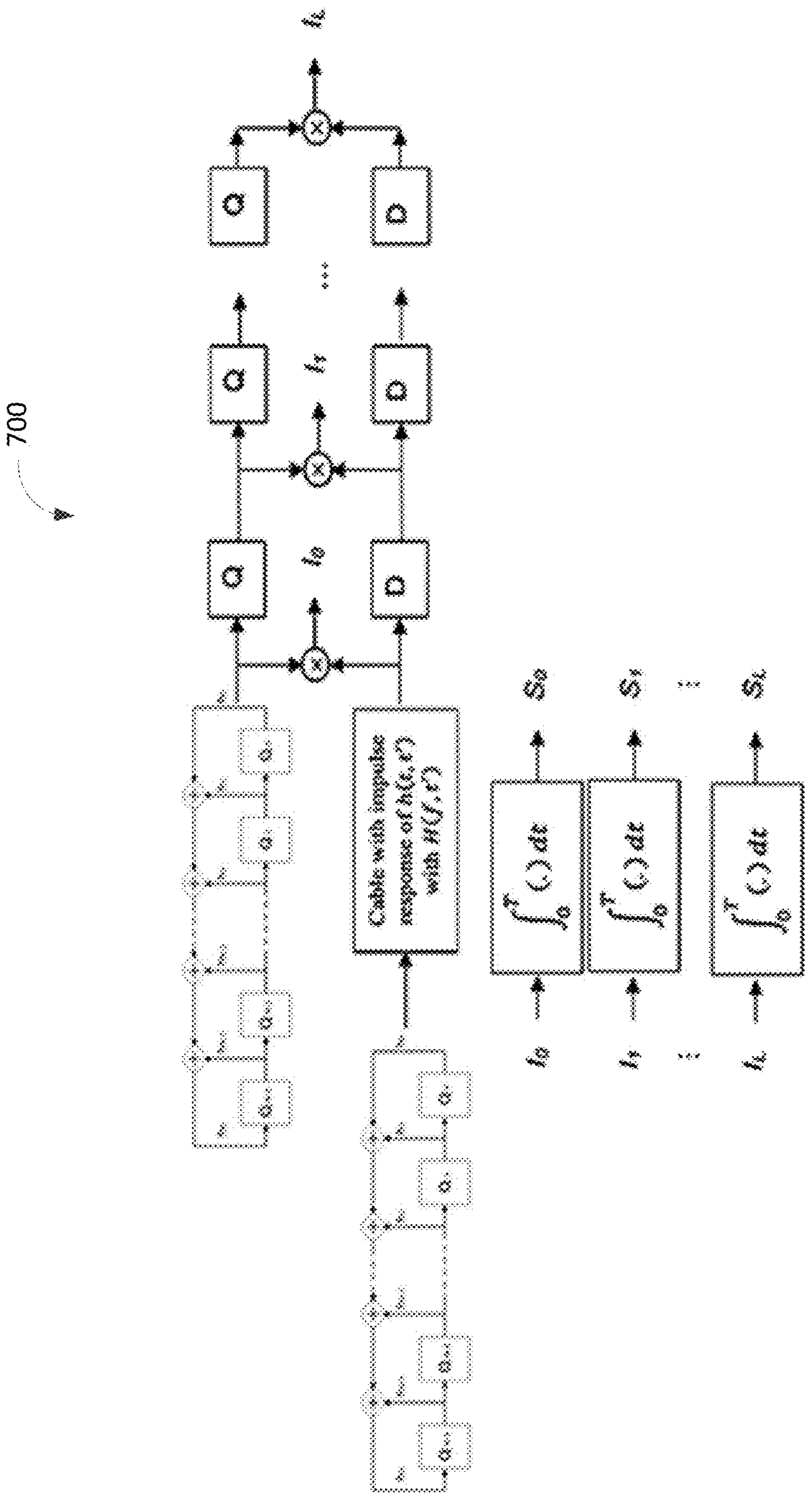
FIG. 7 shows a block diagram of a structure of a transmitter and receiver designed to monitor for variations of the impulse response of a channel.

Reference is now made to FIG. 7, which shows a block diagram of a structure 700 of a transmitter and receiver designed to monitor for variations of the impulse response of a channel (e.g. power cable) using cross-correlation between a baseband signal (e.g. an unmodulated PN-sequence) that has travelled through the cable, and the same signal that has not.

In the depicted structure 700, the D elements represent time delay elements with a delay value of $$\frac{T_c}{2}.$$

The Q elements represent the signal without time delay. The signal $l_i$ is the cross product of the signal with a delayed version of itself. The parameter L depends on the cable time spread, $T_s$, where time spread refers to the impulse response duration. This spreading can occur due to various factors such as multipath propagation, where the signal takes multiple paths to reach the power receiver, each with a different delay, or due to dispersion effects in the medium through which the signal is physically transmitted. L is measured by measuring the time spread (e.g. delay spread) of the cable over time and can be calculated as follows:

$$L=\frac{2T_s}{T_c}$$

The fault detection system may estimate the impulse response of the cable by measuring the integral (represented by $S_0, S_1, \ldots, S_L$ in the structure 700 shown in FIG. 7) of the cross product of the original signal, and the signal after it has passed through the cable. The impulse response is then monitored for any variations (of $S_0, S_1, \ldots, S_L$) to detect electrical faults on the cable. In other words, the fault detection system monitors the cross correlation between the received signal and the original signal and, in particular, monitors for changes in the cross correlation since those changes may be indicative of a detected electrical fault on the cable.

The original signal, P(t), that is generated at the power receiver, can be modulated by a carrier signal with a given frequency to transform it from baseband into a mid-band range frequency where the channel frequency response is more sensitive to the fault, taking advantage of the skin effect. Then P(t) may be extracted from the received signal by multiplying the received signal (that was sent from the DC power receiver end) by $\cos(2\pi f_c t)$ and, after passing it through a low pass filter, the received signal may be compared with the original sequence to estimate the behavior of the cable (i.e. estimate the presence of an electrical fault). The block diagram of such as system is shown in FIG. 4 and described above.

Referring again to FIG. 4, the cross correlation between the transmitted sequence and the received sequence, P(t) and P'(t), respectively may be determined as follows:

$$E(P(t)P'(t-\tau))=R_{PP'}(\tau)=\frac{1}{T}\int_{-\infty}^{+\infty}P(t)P'(t-\tau)dt$$

In the above expression, $E(P(t)P'(t-\tau))$ is the expected value of $P(t)P'(t-\tau)$. The variation of the channel may be reflected in changes in the value of the cross-correlation, $R_{pp'}(\tau)$. The cross-correlation may, in some examples, be determined as follows:

$$\begin{aligned}R_{PP'}(\tau)&=R_{PP}(\tau)*h(t',\tau)\\&=R_{PP}(\tau)*\sum_{i=0}^{\infty}\alpha_i(t')\delta(\tau-t_0-i\tau_s)\\&=\sum_{i=0}^{\infty}\alpha_i(t')R_{PP}(\tau-t_0-i\tau_s)\end{aligned}.$$

From the value of $R_{pp}(\tau)$ when N goes to infinity the above relation can be simplified as follows:

$$\sum_{i=0}^{\infty}\alpha_i(t')\Lambda(t'-t_0-i\tau_s),$$

In the above expression, Λ(t') can be represented as follows:

$$\Lambda(t')=\begin{cases}1-\frac{1}{T_c}|t'|, & |t'|<T_c\\ 0, & |t'|>T_c\end{cases}.$$

Accordingly, when $T_c$ goes to zero the value of Λ(t') converges to the delta function which shows that the above relation provides a good estimation of the channel.

It will be appreciated that it may be that some or all of the above-described operations of the various above-described example methods may be performed in orders other than those illustrated and/or may be performed concurrently without varying the overall operation of those methods. It will also be appreciated that some or all of the above-described operations of the various above-described example methods may be performed in response to other above-described operations.

It will be understood that the applications, modules, routines, processes, threads, or other software components implementing the described method/process may be realized using standard computer programming techniques and languages. The present application is not limited to particular processors, computer languages, computer programming conventions, data structures, or other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A fault detection system for detecting a fault condition in a direct current (DC) system, the system comprising:

- a power transmitter including a DC source to energize a cable;
- a power receiver connected to the cable to couple the cable to a load; and
- at the power receiver, a signal generator coupled to the cable to generate and propagate a periodic signal on the cable,
- at the power transmitter,
  - a power detector coupled to the cable to receive the periodic signal after propagation through the cable and to output a power signal proportional to root-mean-square (RMS) power of the periodic signal,
  - a differentiator to receive the power signal and to produce a power rate-of-change signal, and
  - a fault detection circuit to output a fault signal based on the power rate-of-change signal.

2. The fault detection system of claim 1, wherein the fault detection circuit includes a comparator to compare the power rate-of-change signal to a threshold level and to output the fault signal if the power rate of change signal is greater than the threshold level.

3. The fault detection system of claim 2, wherein the fault detection circuit further includes a variance detector to monitor variance of the power rate-of-change signal and to adjust the threshold signal to ensure it remains above a noise level of the power rate-of-change signal.

4. The fault detection system of claim 1, further including a first bandpass filter to filter the periodic signal after propagation through the cable and before input to the power detector.

5. The fault detection system of claim 4, further including a second filter to filter the power rate-of-change signal prior to the fault detection circuit to filter out rate-of-change values below a minimum rate.

6. The fault detection system of claim 5, wherein the second filter is a second bandpass filter configured to filter out rate-of-change values above a maximum value.

7. The fault detection system of claim 1, further comprising a transient filter at the output of the fault detection circuit to filter the fault signal to exclude transient short duration positive fault signals.

8. The fault detection system of claim 7, wherein the transient filter includes a time delay circuit and a comparator to compare the fault signal to a delayed version of the fault signal to detect transient short duration positive fault signals.

9. The fault detection system of claim 1, wherein the power detector includes a power amplifier to amplify the periodic signal received through the cable.

10. The fault detection system of claim 9, wherein the power amplifier is a voltage-controlled amplifier, and wherein the power detector includes a feedback loop providing a control signal to the voltage-controlled amplifier, the feedback loop including an integrator to produce the control signal based on a difference signal obtained from the difference between the power signal and a reference signal.

11. The fault detection system of claim 1, wherein the signal generator is coupled to the cable through a first AC coupling, and wherein the power detector is coupled to the cable through a second AC coupling.

12. The fault detection system of claim 1, further comprising a termination impedance at the power transmitter, wherein the termination impedance is selected to match a characteristic impedance of the cable.

13. The fault detection system of claim 1, further comprising a disconnection circuitry that receives the fault signal and is configured to disconnect the DC source from the cable in response to the fault signal.

14. The fault detection system of claim 13, wherein the disconnection circuitry further includes a discharge circuit configured to couple the cable to ground in response to the fault signal when the cable is disconnected from the DC source.

15. The fault detection system of claim 1, wherein the signal generator includes a modulator for modulating the periodic signal with a code.

16. The fault detection system of claim 15, wherein the code is a pseudo-random code.

17. The fault detection system of claim 1, wherein the signal generator is a sine wave generator, and wherein the periodic signal is a sinusoidal signal.

18. The fault detection system of claim 1, wherein the cable is configured as a transmission line or as a long-wire antenna.

19. A fault detection system for detecting a fault condition in a direct current (DC) system, the system comprising:

a power transmitter including a DC source to energize a cable;

a power receiver connected to the cable to couple the cable to a load; and at the power receiver, a signal generator coupled to the cable to generate and propagate a periodic signal on the cable, at the power transmitter, means to measure root-mean-square (RMS) power of the periodic signal and to output a power signal proportional to the RMS power of the periodic signal, means to measure a rate-of-change of the power signal and to output a rate-of-change signal, and means to compare the rate-of-change signal to a threshold and to output a fault signal if the rate-of-change signal exceeds the threshold.

20. The fault detection system of claim 19, further comprising means to filter the rate-of-change signal to exclude changes slower than a minimum rate and changes faster than a maximum rate.

* * * * *